US012784738B2

(12) United States Patent
Boehlke

(10) Patent No.: US 12,784,738 B2
(45) Date of Patent: *Nov. 3, 2026

(54) SYSTEMS AND METHODS FOR DATA TRANSMISSION

(71) Applicant: Datavault AI Inc., Beaverton, OR (US)

(72) Inventor: Kenneth A. Boehlke, Portland, OR (US)

(73) Assignee: Datavault AI Inc., Philadelphia, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 19/406,310

(22) Filed: Dec. 2, 2025

(65) Prior Publication Data

US 2026/0088016 A1 Mar. 26, 2026

Related U.S. Application Data

(63) Continuation of application No. 18/196,388, filed on May 11, 2023, now Pat. No. 12,488,783.

(60) Provisional application No. 63/340,901, filed on May 11, 2022.

(51) Int. Cl.

| | |
|---|---|
| ***G10L 15/04*** | (2013.01) |
| ***G10L 15/28*** | (2013.01) |
| ***G10L 25/72*** | (2013.01) |
| ***H03M 13/00*** | (2006.01) |
| ***H04B 1/18*** | (2006.01) |

(52) U.S. Cl.

CPC ............ *G10L 15/04* (2013.01); *G10L 15/285* (2013.01); *G10L 25/72* (2013.01); *H03M 13/6516* (2013.01); *H04B 1/18* (2013.01)

(58) Field of Classification Search

CPC ....... G10L 15/04; G10L 15/285; G10L 25/72; H03M 13/6516; H04B 1/18

See application file for complete search history.

(56) References Cited

U.S. PATENT DOCUMENTS

| | | | | |
|---|---|---|---|---|
| 10,819,374 | B2 | 10/2020 | Ruano | |
| 11,025,600 | B1 | 6/2021 | Medard | |
| 12,488,783 | B1 * | 12/2025 | Boehlke | G10L 15/04 |
| 2020/0028624 | A1 | 1/2020 | Fouli | |

* cited by examiner

*Primary Examiner* — Joseph J Lauture

(74) *Attorney, Agent, or Firm* — Greenberg Traurig, LLP; Chinh H. Pham; Kristopher Reichlen

(57) ABSTRACT

According to disclosed embodiments, methods and systems of data transmission are provided. A data stream is received. The data stream is parsed into a plurality of symbol sets. A number of encoded symbol sets are generated by linearly combining at least two of the symbol sets using a coefficient matrix. The encoded symbols are packetized into encoded data packets. The encoded data signals are transmitted over at least one communication link.

20 Claims, 5 Drawing Sheets

SYSTEMS AND METHODS FOR DATA TRANSMISSION

CROSS-REFERENCE TO RELATED APPLICATIONS

This application is a continuation of U.S. Non-provisional patent application Ser. No. 18/196,388, filed May 11, 2023 now U.S. Pat. No. 12,488,783 which claims the benefit of U.S. Provisional Patent Application No. 63/340,901, filed May 11, 2022, which are incorporated by reference herein in their entirety.

FIELD OF THE DISCLOSURE

The present disclosure is related generally to the wireless distribution of high-quality audio signals and, in particular to systems and methods of distributing high-bitrate, multi-channel, audio wirelessly while maintaining low latency.

BACKGROUND

Generally, a key element of a positive customer experience with wireless audio systems is a robust-low latency wireless link. Low latency audio is desirable for enabling good audio to video synchronization (or Lip Sync). For example, low latency audio systems allow for compatibility with abroad range of televisions. A low latency audio system will work with both low and high latency televisions as the transmitted audio can always be delayed to match the video.

On the other hand, an audio system with high latency may be incompatible with low latency televisions because the audio cannot be advanced to match the video.

Low latency requires quick access to the radio medium as well as low computational times. Techniques found in the art have failed to achieve significant latency reductions due to the high-cost computation resources required to achieve accurate transmission with low latency.

BRIEF SUMMARY

The present disclosure provides for novel systems and methods of audio transmission that alleviate shortcomings in the art, and provide novel mechanisms for robust and scalable audio transmission using Alphabet Linear Network Coding (ALNC). In some embodiments, a method of audio transmission may use a small and/or fixed Alphabet of Codes. In some embodiments, ALNC may use Galois fields. In some embodiments, methods disclosed herein may use a non-singular code subset of a Galois field.

According to some embodiments, methods of audio transmission discussed herein use a multi-radio architecture. As will be noted, a multi-radio architecture increases the likelihood that a given radio has an opportunity to transmit in one band while another radio in a different band can also transmit. In some embodiments, using a multi-radio architecture may allow for reduced latency.

The present disclosure relates to systems, methods, and devices for robust transmission and recovery of data streams using linear combinations of symbol sets and flexible, multichannel communication architectures. In certain embodiments, a transmitting device receives a data stream and parses the data into symbol sets that may represent audio, video, control information, or other digital data. The device generates encoded symbol sets by applying linear combination operations using one or more coefficient matrices, which may include predetermined matrices stored in lookup tables or matrices selected dynamically based on operating conditions. The encoded symbol sets are then packetized and transmitted as encoded data packets over one or more communication links.

The disclosed systems support a wide range of transmission configurations, including multi-radio architectures, frequency diversity, modulation diversity, and the use of varying bandwidths, transmission methods, and physical-layer protocols. Distinct subsets of the encoded data packets may be transmitted over different radios, channels, or communication methods (including, for example, broadcast, multicast, or unicast), improving the reliability and latency characteristics of the transmission.

At a receiving device, a subset of the encoded packets is sufficient to reconstruct the original symbol sets. The receiver identifies or determines an appropriate decoding coefficient matrix, such as by retrieving an inverse matrix from a lookup table or by computing a matrix inverse at runtime. The receiver reconstructs the symbol sets using linear algebraic decoding operations and outputs the recovered data stream. The decoding process may incorporate hardware-accelerated or parallelized operations to further reduce latency.

The systems and methods described herein provide significant benefits over conventional wireless or wired data transport methods. Among these benefits are improved robustness to packet loss, reduced latency, efficient decoding using precomputed tables, and flexibility across a wide variety of radio technologies and network conditions. The disclosed architecture is compatible with Alphabet Linear Network Coding (ALNC) and other linear network coding models, and it can be applied to numerous types of data streams within high-performance audio, video, multimedia, and general data communication systems.

BRIEF DESCRIPTION OF THE SEVERAL VIEWS OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

Figure 1:
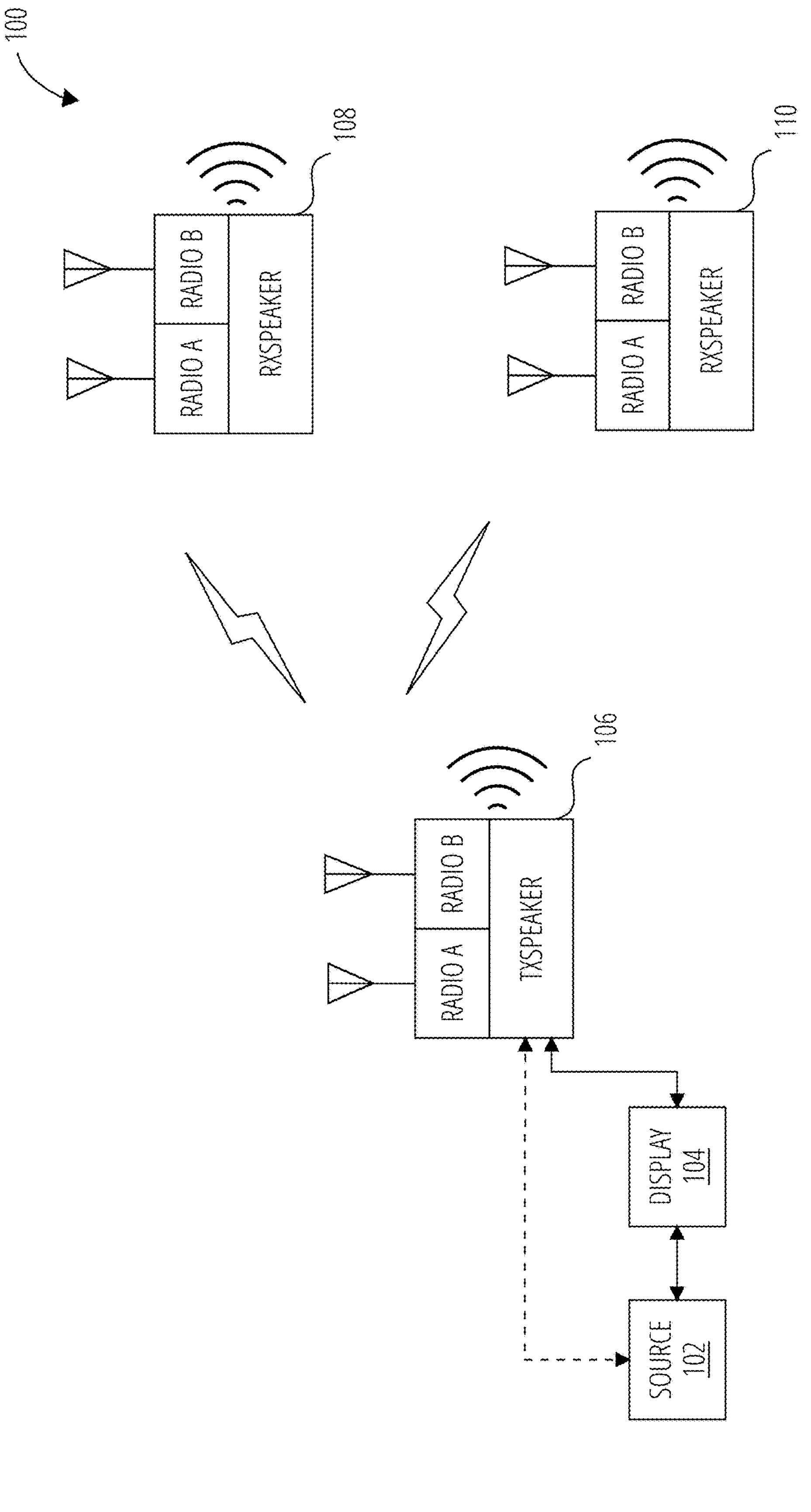
FIG. 1 is a block diagram illustrating components of an exemplary system according to some embodiments of the present disclosure.

The present disclosure will now be described more fully hereinafter with reference to the accompanying drawings, which form a part hereof, and which show, by way of non-limiting illustration, certain example embodiments.

Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware, or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

The present disclosure is described below with reference to block diagrams and operational illustrations of methods and devices. It is understood that each block of the block diagrams or operational illustrations, and combinations of blocks in the block diagrams or operational illustrations, can be implemented by means of analog or digital hardware and computer program instructions. These computer program instructions can be provided to a processor of a general-purpose computer to alter its function as detailed herein, a special purpose computer, ASIC, or other programmable data processing apparatus, such that the instructions, which execute via the processor of the computer or other programmable data processing apparatus, implement the functions/acts specified in the block diagrams or operational block or blocks. In some alternate implementations, the functions/acts noted in the blocks can occur out of the order noted in the operational illustrations. For example, two blocks shown in succession can in fact be executed substantially concurrently or the blocks can sometimes be executed in the reverse order, depending upon the functionality/acts involved.

For the purposes of this disclosure a non-transitory computer readable medium (or computer-readable storage medium/media) stores computer data, which data can include computer program code (or computer-executable instructions) that is executable by a computer, in machine readable form. By way of example, and not limitation, a computer readable medium may comprise computer readable storage media, for tangible or fixed storage of data, or communication media for transient interpretation of code-containing signals. Computer readable storage media, as used herein, refers to physical or tangible storage (as opposed to signals) and includes without limitation volatile and non-volatile, removable and non-removable media implemented in any method or technology for the tangible storage of information such as computer-readable instructions, data structures, program modules or other data. Computer readable storage media includes, but is not limited to, RAM, ROM, EPROM, EEPROM, flash memory or other solid state memory technology, optical storage, cloud storage, magnetic storage devices, or any other physical or material medium which can be used to tangibly store the desired information or data or instructions and which can be accessed by a computer or processor.

A computing device may be capable of sending or receiving signals, such as via a wired or wireless network, or may be capable of processing or storing signals, such as in memory as physical memory states, and may, therefore, operate as a server. Thus, devices capable of operating as a server may include, as examples, dedicated rack-mounted servers, desktop computers, laptop computers, set top boxes, integrated devices combining various features, such as two or more features of the foregoing devices, or the like.

For purposes of this disclosure, a client (or consumer or user) device may include a computing device capable of sending or receiving signals, such as via a wired or a wireless network. A client device may, for example, include a desktop computer or a portable device, such as a cellular telephone, a smart phone, a display pager, a radio frequency (RF) device, an infrared (IR) device an Near Field Communication (NFC) device, a Personal Digital Assistant (PDA), a handheld computer, a tablet computer, a phablet, a laptop computer, a set top box, a wearable computer, smart watch, an integrated or distributed device combining various features, such as features of the forgoing devices, or the like.

The detailed description provided herein is not intended as an extensive or detailed discussion of known concepts, and as such, details that are known generally to those of ordinary skill in the relevant art may have been omitted or may be handled in summary fashion.

An aspect of the present disclosure is the encoding of data packets using ALNC. In some embodiments, to encode using ALNC, original source data may be divided into symbols of a given size and linearly combined. In some embodiments, each symbol is multiplied with a scalar coding coefficient. In some embodiments, the coefficient may be drawn sequentially from a Galois field table (the table is a non-singular code set). In some embodiments, the resulting coded symbol is of the same size as the original data symbols.

As will be noted, a finite field or Galois field may be a field that contains a finite number of elements. In some embodiments, a finite field is a set on which the operations of multiplication, addition, subtraction and division are defined and satisfy certain basic rules. During a setup phase, systems using ALNC encoding may calculate the coefficients and inverse coefficient to be used for encoding and decoding at runtime. In some embodiments, the coefficient and inverse coefficients may be stored in look-up tables (LUTs) for quick and efficient access during operation.

Certain embodiments will now be described in greater detail with reference to the figures.

In general, with reference to FIG. 1, a system 100 in accordance with an embodiment of the present disclosure is shown. FIG. 1 shows components of a general environment in which the systems and methods discussed herein may be practiced. Not all the components may be required to practice the disclosure, and variations in the arrangement and type of the components may be made without departing from the spirit or scope of the disclosure. In some embodiments, different components of system 100 may be combined into a single device.

As shown, system 100 of FIG. 1 may include a data source 102, display 104, a transmitter-speaker (TxSpeaker) 106, and one or more receiver-speakers (e.g., RxSpeakers 108 and 110). In some embodiments, RxSpeakers 108-110 may be referred to as wireless satellite units. In some embodiments, TxSpeaker 106 and RxSpeakers 108-110 may include one or more microphones and one or more speakers.

In some embodiments, source 102 may be a source of digital audio and/or video. In some embodiments, source 102 can include the internet. In some embodiments, source 102 may transmit an audio/video stream including a plurality of packets. In some embodiments, source 102 may be a media player, a gaming console, a networking device, a mobile device, or any other device capable of reproducing and/or transmitting media. In some embodiments, an audio/video stream may be provided to a display 104 for displaying (e.g., a television, a projector, a display monitor) visual media associated with the audio/video stream.

For example, in an embodiment, where the source 102 is a gaming console, source 102 may transmit audio and/or graphics corresponding to gameplay to the display 104. In turn, display 104 may display the graphics. In some embodiments, an audio component of a media stream may be transmitted directly from the source 102 to the TxSpeaker 106. In some embodiments, the media steam may be transmitted from the source 102 to the display 104 and, in turn, the display 104 may transmit audio information corresponding to the media stream to the TxSpeaker 106.

According to some embodiments, TxSpeaker 106 may process the audio information and transmit the processed or transformed audio information to the one or more RxSpeakers (e.g., RxSpeaker 108 and RxSpeaker 110).

According to some embodiments, system 100 may be a multi-radio architecture. In some embodiments, data transmitters and receivers of system 100 may utilize one or more radio chains to communicate. For example, in the non-limiting embodiment of FIG. 1, TxSpeaker 106 and RxSpeakers 108 and 110 have two radio chains Radio A and Radio B. In some embodiments, TxSpeaker 106 and RxSpeakers 108 and 110 may have one or more radio chains.

In an embodiment, TxSpeaker 106 and RxSpeakers 108 and 110 may communicate through independent radio chains. For example, in some embodiments, TxSpeaker 106 may communicate with RxSpeakers 108 and 110 through Radio A, Radio B, or both. It will be noted that, in some embodiments, any radio chain of TxSpeaker 106 and RxSpeakers 108 and 110 may communicate with any other radio chain. For example, in some embodiments, TxSpeaker 106 may use Radio A to communicate with Radio B of RxSpeaker 108 while communicating with Radio A of RxSpeaker 110. In some embodiments, any TxSpeaker or RxSpeaker may communicate with any other of TxSpeaker or RxSpeaker using any type of digital communications (including wired and wireless) known or to be known without departing from the scope of the present disclosure.

According to some embodiments, Radio A and Radio B may use Channel A and Channel B, respectively. In some embodiments, Channel A and Channel B may have a channel frequency. In some embodiments, Channel A and Channel B may be separated in channel frequency or band of operation (e.g., Frequency Diversity). In some embodiments, Channel A and Channel B may in the same band but have different bandwidths (e.g., 20/40/80/160 MHz bandwidth in 802.11ac). In some embodiments, Channel A and Channel B may be separated in time (e.g., Temporal Diversity). That is, in some embodiments, data packets may be sent over Channel A and/or Channel B at a different time slots to overcome a burst interference that has interfered with a primary time slot.

According to some embodiments, Channel A and Channel B may be separated in a Modulation Coding Scheme (e.g., Coding Diversity). That is, in some embodiments, data packets may be sent using different physical layer rates of a f a wireless network protocol. For example, in some embodiment, a physical layer rate may be 6 Mbps using Binary Phase-Shift Keying (BPSK) and a coding rate of 1/2 as disclosed in 802.11a. In some embodiments, a physical layer rate may be 54 Mbps using 64-QAM scheme and a coding rate of 3/4 as disclosed in 802.11a.

According to some embodiments, Channel A and Channel B may have different communication methods (e.g., Broadcast/Multicast v. Unicast). In some embodiments, where the channel communication method is Broadcast/Multicast, data packets may be transmitted to multiple receivers at the same time. In some embodiments, where the channel communication method is unicast, a transmitter may transmit data packets to individual receivers independently. It will be noted that as used herein, any of TxSpeaker 106, RxSpeaker 108, and RxSpeaker 110 may act be a receiver, a transmitter, or both.

According to some embodiments, Channel A and Channel B may have different retransmission methods (e.g., User Datagram Protocol (UDP), Transmission Control Protocol/Internet Protocol (TCP/IP)). In some embodiments, where the retransmission method is UDP, data packets may be sent without acknowledgment. In some embodiments, where the retransmission method is TCP/IP, acknowledgment of packet loss and retransmission of lost packets is supported.

According to some embodiments, Channel A and Channel B may use different radio Physical Layers (e.g., Orthogonal Frequency Domain Multiplexing (OFDM) as disclosed in 802.11a/n/ac, Frequency Hopping Spread Spectrum (FHSS) as disclosed by the Bluetooth standard, and Code Division Multiple Access (CDMA) as disclosed in 802.11b). In some embodiments, different Physical Layers can cover the same frequency band but use different medium access methods and spectral reuse properties. For example, in some embodiments, 802.11g and Bluetooth both share the 2.4 GHz Band, however, 802.11g may move from one 20 MHz Channel to another while Bluetooth dynamically may hop over an entire 80 MHz band in one packet period.

Figure 2:
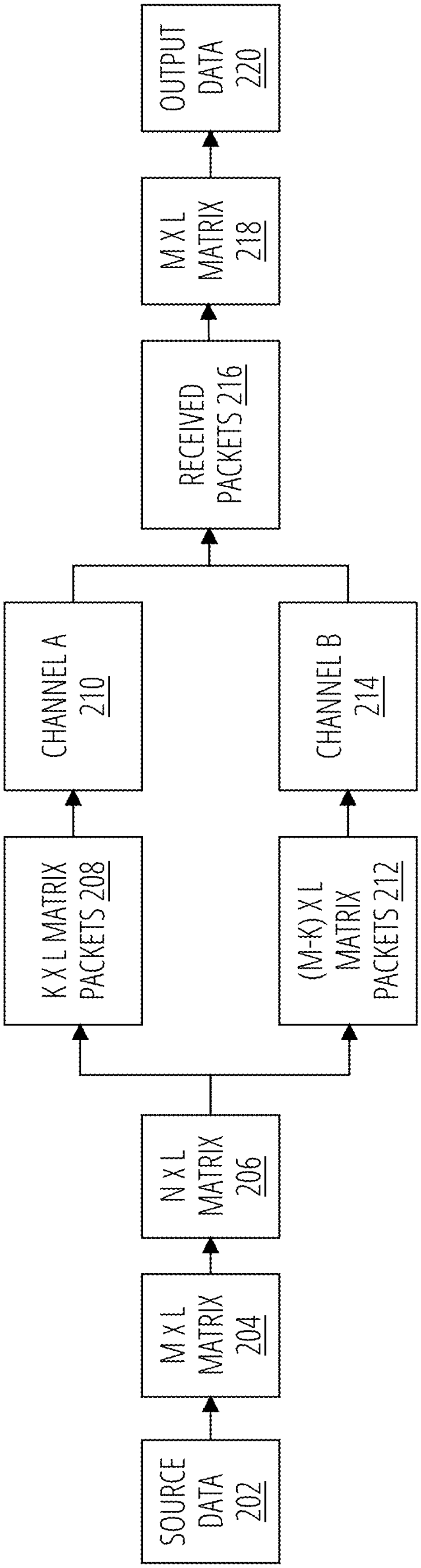
FIG. 2 illustrates a non-limiting dataflow for transmitting data according to some embodiments of the present disclosure.

Turning now to FIG. 2, FIG. 2 illustrates a non-limiting dataflow for transmitting data in accordance with embodiments of the present disclosure. In FIG. 2, a data stream from a data source (e.g., source 102) is received by a device (e.g., TxSpeaker 106). In some embodiments, the data stream includes an M number of packets and each packet has a length L. In some embodiments, the device may convert at least a portion of the data stream into an M×L matrix 204 where M corresponds to the number of columns and L corresponds to the number of rows in the matrix 204. In some embodiments, this relationship may be described as a column vector M of row vectors R:

$$\begin{bmatrix} R_0 \\ \vdots \\ R_{M-1} \end{bmatrix} = \begin{bmatrix} D_{0,0} & \dots & D_{0,L-1} \\ \vdots & \ddots & \vdots \\ D_{M-1,0} & \dots & D_{M-1,L-1} \end{bmatrix}$$

Then, in some embodiments, matrix 204 may be encoded using ALNC coded into matrix 206 for transmission to the RxSpeaker receiver. In some embodiments, matrix 206 may be a P vector of N rows of length L (where N>M). In some embodiments, matrix 206 may be described by the following equation:

$$\begin{bmatrix} P_0 \\ \vdots \\ P_{N-1} \end{bmatrix} = \begin{bmatrix} C_{0,0} & \dots & C_{0,M-1} \\ \vdots & \ddots & \vdots \\ C_{N-1,0} & \dots & C_{N-1,M-1} \end{bmatrix} \begin{bmatrix} R_0 \\ \vdots \\ R_{M-1} \end{bmatrix}$$

In some embodiments, the N rows of matrix 206 may be split into to two matrices (matrix 208 and matrix 212). In some embodiments, matrix 208 may contain K rows of length L. In some embodiments, matrix 212 may contains (M-K) rows of length L. In some embodiments, matrix 208 is packetized into K packets and transmitted by the device over Channel A 210 (e.g., using Radio A of TxSpeaker 106). In some embodiments, matrix 212 is packetized into M-K packets and transmitted by the device over Channel B 214 (e.g., using Radio B of TxSpeaker 106).

In some embodiments, the K packets transmitted over Channel A and the M-K packets transmitted over Channel B may be received by one or more receiving devices (e.g., RxSpeaker 108 and RxSpeaker 110) over a Radio A and/or a Radio B of each receiving device.

In some embodiments, the received packets 216 are decoded to recover some or all of the data of the source data 202. In some embodiments, M number of the N transmitted packets may be sufficient to recover the source data. For example, in an embodiment where M=4 number of packets are received, the source data may be recovered using the equation:

$$\begin{bmatrix} R_0 \\ \vdots \\ R_3 \end{bmatrix} = \begin{bmatrix} C_{A,0} & \dots & C_{A,3} \\ \vdots & \ddots & \vdots \\ C_{D,0} & \dots & C_{D,3} \end{bmatrix} \begin{bmatrix} C_{A,0}P_0 + C_{A,1}P_1 + C_{A,2}P_2 + C_{A,3}P_3 \\ \vdots \\ C_{D,0}P_0 + C_{D,1}P_1 + C_{D,2}P_2 + C_{D,3}P_3 \end{bmatrix}$$

In the equation above, the M packets are labeled as A, B, C, and D. Then, in some embodiments, the column vector of M of row vectors R may be reconstituted into the data matrix 218 of size M×L at the receiving device (represented by the equation below). In some embodiments, matrix 218 may be identical to matrix 204.

$$\begin{bmatrix} D_{0,0} & \dots & D_{0,L-1} \\ \vdots & \ddots & \vdots \\ D_{M-1,0} & \dots & D_{M-1,L-1} \end{bmatrix} = \begin{bmatrix} R_0 \\ \vdots \\ R_M \end{bmatrix}$$

In some embodiments, to recover the matrix 204 the coefficient equations may be invertible. As will be noted, in some embodiments, an invertible matric is said to be non-singular. In some embodiments, a matrix may be determined to be a singular matrix or a non-singular matrix based on its determinant. For example, in a non-limiting embodiment, the determinant of a matrix 'A' is denoted by 'det A' or '|A|'. Then, in some embodiments, if the determinant of a matrix is zero, then it is said to be a singular matrix and it is not invertible.

In some embodiments, the probability of a zero determinant is, assuming randomness in the calculation, the probability of a zero in a Galois field. That is, in some embodiments, this probability is 1 out of the size of the Galois field and it may be the probability of a failure caused by an undecodable block of M packets as below shown below. In some embodiments, a Galois field may have a size 4, 16, 32, 64, 128, or 256.

$$\text{Probability of Block Singular Failure: } P_{BSF} = 1/GF \text{ size}$$

In some embodiments, where at least M packets received may be decoded, in order for the coefficients to be non-singular in all conditions, each possible packet receiving combination may be verified. Then, in some embodiments, the number of packet coefficient combinations and the resulting probability that all combinations are non-singular is described as below:

$$\text{Possible Packet Combinations: } PPC = \frac{N!}{M! * (N-M)!}$$

$$\text{Probability of All Combinations Good: } P_{ACG} = (1 - P_{BSF})^{PPC}$$

For example, in some non-limiting embodiments, where Galois Field is of size 16 and size 256, the probabilities may be as follows:

| Number of Packets | | | GF(16) | | GF(256) | |
|---|---|---|---|---|---|---|
| M | N | PPC | PBSF | PACG | PBSF | PACG |
| 2 | 4 | 6 | 6.25% | 67.9% | 0.39% | 97.7% |
| 2 | 5 | 10 | 6.25% | 52.4% | 0.39% | 96.2% |
| 3 | 6 | 20 | 6.25% | 27.5% | 0.39% | 92.4% |
| 3 | 8 | 56 | 6.25% | 2.7% | 0.39% | 80.3% |
| 4 | 8 | 70 | 6.25% | 1.09% | 0.39% | 76.0% |
| 4 | 10 | 210 | 6.25% | 1.3e−6 | 0.39% | 44.0% |
| 5 | 10 | 252 | 6.25% | 8.65e−8 | 0.39% | 37.3% |
| 5 | 13 | 1287 | 6.25% | 8.45e−37 | 0.39% | 0.65% |

In some embodiments, the coefficients and the inverse coefficients may be precalculated and stored in the transmitting and receiving devices, respectively. In some embodiments, the coefficients and/or inverse coefficients may be stored in look-up tables (LUTs) for quick and efficient access at runtime.

In some embodiments, matrix 218 may then be transformed to generate output data 220. In some embodiments, output data 220 may be interpreted by a device to output audio or video to a user.

Figure 3:
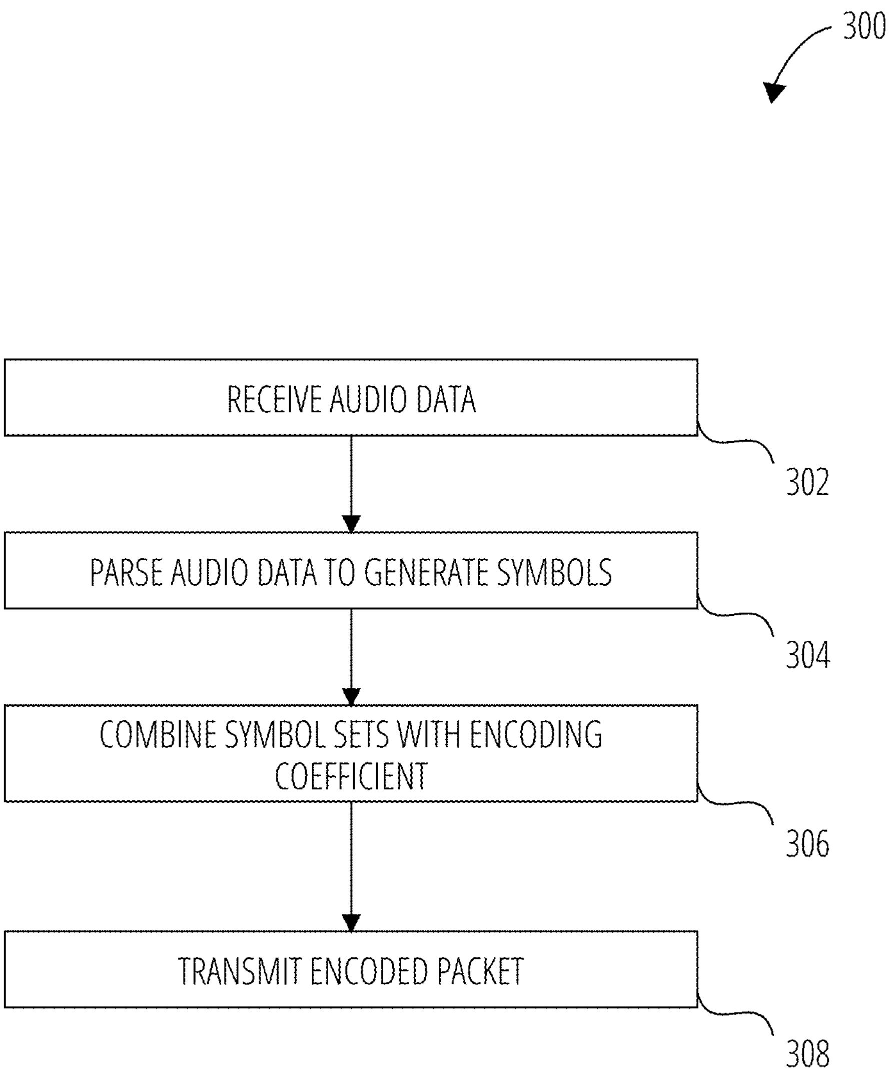
FIG. 3 illustrates a process for encoding and transmitting data according to some embodiments of the present disclosure.

Turning to FIG. 3, Process 300 details a non-limiting embodiment for audio transmission. The Steps of Process 300 may be performed with respect to the environment discussed in relation to FIG. 1 and the dataflow discussed in relation to FIG. 2.

Process 300 begins at Step 302 where a data stream is received. In some embodiments, the data stream may be an audio data stream. In some embodiments, the data stream may be a video data stream. In Step 304, the received data stream is parsed into a plurality of symbol sets. In some embodiments, a symbol set is a representation of digital data. In some embodiments, in Step 304, the data stream is parsed into an M number of symbol sets.

In Step 306, one or more of the symbols sets may be combined with an encoding coefficient matrix to generate an N number of encoded symbol sets. In some embodiments, the coefficient matrix may be a predetermined coefficient matrix calculated prior to runtime and stored in a LUT. In some embodiments, the coefficient matrix may be calculated at runtime. In some embodiments, the coefficient matrix may be calculated using a Galois field. Then, in Step 308, the encoded N number of packets may be transmitted.

Figure 4:
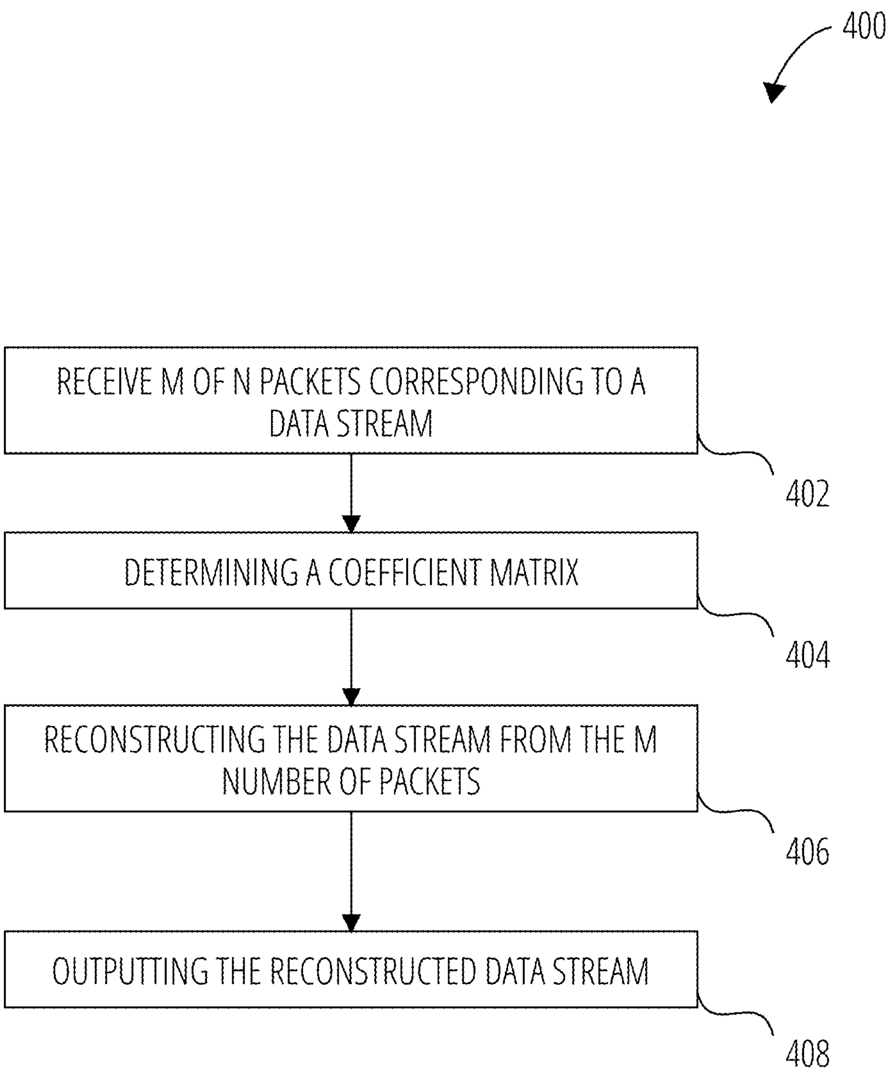
FIG. 4 illustrates a process for receiving and decoding data according to some embodiments of the present disclosure.

Turning to FIG. 4, Process 400 details a non-limiting embodiment for audio transmission. The Steps of Process 400 may be performed with respect to the environment discussed in relation to FIG. 1 and the dataflow discussed in relation to FIG. 2.

Process 400 begins at Step 402 where an M number of encoded packets from a group having N number of packets is received. In some embodiments, the encoded packets correspond to a data stream. In some embodiments, the data stream may be an audio data stream. In some embodiments, the data stream may be a video data stream.

In Step 404, a decoding coefficient matrix corresponding to an encoding coefficient matrix may be determined. In some embodiments, the decoding coefficient matrix is an inverse of the encoding coefficient matrix. In some embodiments, the decoding coefficient matrix may be predetermined and stored in a LUT prior to runtime. In some embodiments, the decoding coefficient matrix may be calculated at runtime.

In Step 406, the data stream may be reconstructed from the M number of packets using the decoding coefficient matrix. In some embodiments, the reconstructed data stream is substantially similar to the original data stream, such that when the reconstructed data stream is outputted (e.g., played or displayed) to a user it is indistinguishable from the outputted original data stream. In some embodiments, the reconstructed data stream is identical to the original data stream.

In Step 408, the reconstructed data stream may be outputted. In some embodiments, outputting the reconstructed data stream may include playing an audio stream over speakers. In some embodiments, outputting the reconstructed data stream may include displaying a video stream over a display.

Figure 5:
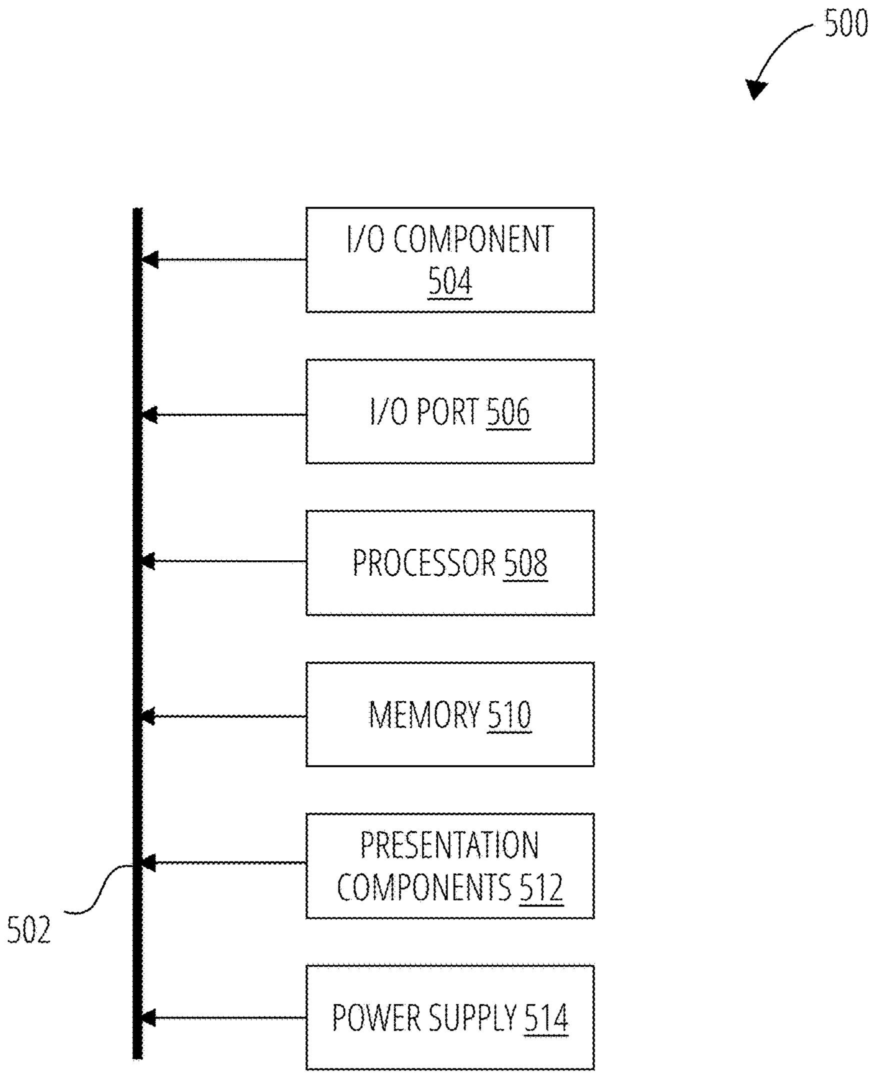
FIG. 5 is a schematic diagram illustrating an example embodiment of a device according to some embodiments of the present disclosure.

Turning now to FIG. 5, FIG. 5 is a schematic diagram illustrating an example embodiment of a device 500 (e.g., a client device, a computing device) that may be used within the present disclosure. In some embodiments, device 500 may be a source 102, a display 104, a TxSpeaker 106, a RxSpeaker 108, a RxSpeaker 110, or a combination thereof as described with respect to FIG. 1. The device 500 is merely an illustrative example of a suitable computing environment and in no way limits the scope of the present disclosure. As used herein, a "device" or "computing device" can include a "workstation," a "server," a "laptop," a "desktop," a "handheld device," a "mobile device," a "tablet computer," or other computing devices, as would be understood by those of skill in the art. Embodiments of the present disclosure may utilize any number of devices 500 in any number of different ways to implement a single embodiment of the present disclosure. Accordingly, embodiments of the present disclosure are not limited to a single device 500, as would be appreciated by one with skill in the art, nor are they limited to a single type of implementation or configuration of the example device 500.

In some embodiments, device 500 may include a bus 502 that can be coupled to one or more of the following illustrative components, directly or indirectly: input/output (I/O) component 504, I/O port 506, one or more processors 508, one or more memories 510, one or more presentation components 512, and power supply 514. One of skill in the art will appreciate that the bus 502 can include one or more busses, such as an address bus, a data bus, or any combination thereof. One of skill in the art additionally will appreciate that, depending on the intended applications and uses of a particular embodiment, multiple of these components can be implemented by a single device. Similarly, in some instances, a single component can be implemented by multiple devices.

In some embodiments, device 500 can include or interact with a variety of computer-readable media. For example, computer-readable media can include Random Access Memory (RAM), Read Only Memory (ROM), Electronically Erasable Programmable Read Only Memory (EEPROM), flash memory or other memory technologies, CD-ROM, digital versatile disks (DVD) or other optical or holographic media, and magnetic storage devices that can be used to encode information and can be accessed by the devices 500.

In some embodiments, memory 510 can include computer-storage media in the form of volatile and/or nonvolatile memory. In some embodiments, memory 510 may be removable, non-removable, or any combination thereof. For example, in some embodiments, memory 510 may be a hardware device such as hard drives, solid-state memory, optical-disc drives, and the like.

In some embodiments, device 500 can include one or more processors that read data from components such as the memory 510, the various I/O components 504, etc. In some embodiments, presentation components 512 present data indications to a user or other device. For example, in some embodiments, presentation components 512 may include a display device, speaker, a printing component, a haptic component, etc.

In some embodiments, the I/O ports 506 can enable the device 500 to be logically coupled to other devices, such as I/O components 504. In some embodiments, some of the I/O components 504 can be built into the device 500. In some embodiments, I/O component 504 may be a microphone, joystick, recording device, game pad, satellite dish, scanner, printer, wireless device, networking device, and the like. In some embodiments, I/O port 506 may utilize one or more communication technologies, such as USB, infrared, Bluetooth™, or the like.

As utilized herein, the terms "comprises" and "comprising" are intended to be construed as being inclusive, not exclusive. As utilized herein, the terms "exemplary", "example", and "illustrative", are intended to mean "serving as an example, instance, or illustration" and should not be construed as indicating, or not indicating, a preferred or advantageous configuration relative to other configurations. As utilized herein, the terms "about", "generally", and "approximately" are intended to cover variations that may existing in the upper and lower limits of the ranges of subjective or objective values, such as variations in properties, parameters, sizes, and dimensions. In one non-limiting example, the terms "about", "generally", and "approximately" mean at, or plus 10 percent or less, or minus 10 percent or less. In one non-limiting example, the terms "about", "generally", and "approximately" mean sufficiently close to be deemed by one of skill in the art in the relevant field to be included. As utilized herein, the term "substantially" refers to the complete or nearly complete extend or degree of an action, characteristic, property, state, structure, item, or result, as would be appreciated by one of skill in the art. For example, an object that is "substantially" circular would mean that the object is either completely a circle to mathematically determinable limits, or nearly a circle as would be recognized or understood by one of skill in the art. The exact allowable degree of deviation from absolute completeness may in some instances depend on the specific context. However, in general, the nearness of completion will be so as to have the same overall result as if absolute and total completion were achieved or obtained. The use of "substantially" is equally applicable when utilized in a negative connotation to refer to the complete or near complete lack of an action, characteristic, property, state, structure, item, or result, as would be appreciated by one of skill in the art.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure may vary substantially without departing from the spirit of the present invention, and exclusive use of all modifications that come within the scope of the appended claims is reserved. Within this specification embodiments have been described in a way which enables a clear and concise specification to be written, but it is intended and will be appreciated that embodiments may be variously combined or separated without parting from the invention. It is intended that the present invention be limited only to the extent required by the appended claims and the applicable rules of law.

It is also to be understood that the following claims are to cover all generic and specific features of the invention described herein, and all statements of the scope of the invention which, as a matter of language, might be said to fall therebetween.

What is claimed is:

1. A method comprising:
- receiving a data stream;
- parsing the data stream into a plurality of symbol sets;
- generating a plurality of encoded symbol sets by linearly combining at least two of the symbol sets using a coefficient matrix;
- packetizing the plurality of encoded symbol sets into a plurality of encoded data packets; and
- transmitting the plurality of encoded data packets over at least one communication link.

2. The method of claim 1, wherein transmitting comprises transmitting the encoded data packets over a plurality of radio interfaces.

3. The method of claim 1, wherein the coefficient matrix is selected from a predetermined set of encoding matrices stored in a lookup table.

4. The method of claim 1, wherein linearly combining comprises performing matrix multiplication over a finite field, a real-number domain, or an integer domain.

5. The method of claim 1, further comprising distributing different encoded data packets to different radios, channels, bandwidths, or modulation schemes.

6. The method of claim 1, further comprising dynamically selecting the coefficient matrix based on link conditions, packet loss, or channel quality.

7. The method of claim 1, wherein the plurality of encoded data packets comprises more encoded symbol sets than source symbol sets.

8. The method of claim 1, wherein linearly combining comprises applying Alphabet Linear Network Coding.

9. The method of claim 1, wherein the data stream comprises audio, video, control data, or sensor data.

10. The method of claim 1, wherein transmitting comprises simultaneously transmitting different subsets of encoded packets using different transmission methods including broadcast, multicast, or unicast.

11. A method comprising:
- receiving a subset of encoded data packets from a group of encoded data packets;
- identifying or determining a decoding coefficient matrix corresponding to the subset of encoded data packets;
- reconstructing symbol sets of an underlying data stream using the decoding coefficient matrix; and
- outputting the reconstructed data stream.

12. The method of claim 11, wherein determining the decoding coefficient matrix comprises retrieving an inverse matrix from a lookup table.

13. The method of claim 11, wherein the subset comprises any number of encoded packets sufficient to form an invertible matrix.

14. The method of claim 11, wherein reconstructing comprises performing matrix inversion using hardware acceleration or parallel processing.

15. The method of claim 11, further comprising discarding duplicate or corrupted packets based on checksum, sequence number, or radio-layer metadata.

16. The method of claim 11, wherein receiving comprises receiving packets from multiple radios, frequency bands, or temporal slots.

17. The method of claim 11, wherein outputting comprises outputting audio, video, or combined multimedia content.

18. The method of claim 11, wherein the group of encoded packets originates from a transmitter having a plurality of independent radio chains.

19. A device comprising:
- one or more processors; and
- a memory storing instructions that, when executed, cause the device to receive a data stream;
- parse the data stream into a plurality of symbol sets;
- generate a plurality of encoded symbol sets by linearly combining at least two of the symbol sets using a coefficient matrix;
- packetize the plurality of encoded symbol sets into a plurality of encoded data packets; and
- transmit the plurality of encoded data packets over at least one communication link.

20. The device of claim 19, further comprising two or more radio transceivers configured to transmit different encoded packets on different communication channels, wherein the device comprises a speaker, display, audio transmitter, receiver, or satellite speaker unit, and wherein the device is configured to dynamically switch between radios or protocols based on interference, latency, or link-quality metrics.

* * * * *